(12) United States Patent
Shima

(10) Patent No.: US 6,760,606 B1
(45) Date of Patent: Jul. 6, 2004

(54) AUXILIARY MATERIAL FOR SUPERCONDUCTIVE MATERIAL

(75) Inventor: Kunihiro Shima, Kanagawa (JP)

(73) Assignee: Tanaka Kikinzoku Kogyo K.K., Tokyo (JP)

( * ) Notice: Subject to any disclaimer, the term of this patent is extended or adjusted under 35 U.S.C. 154(b) by 0 days.

(21) Appl. No.: 09/787,907

(22) PCT Filed: Apr. 6, 2000

(86) PCT No.: PCT/JP00/02223

§ 371 (c)(1),
(2), (4) Date: Mar. 29, 2001

(87) PCT Pub. No.: WO01/15178

PCT Pub. Date: Mar. 1, 2001

(30) Foreign Application Priority Data

Aug. 20, 1999 (JP) ............................................ 11-272900

(51) Int. Cl.$^7$ ................................................ C22C 5/06
(52) U.S. Cl. ...................................... 505/230; 148/431
(58) Field of Search .......................... 505/230; 148/431, 148/678

(56) References Cited

U.S. PATENT DOCUMENTS

| | | | | |
|---|---|---|---|---|
| 3,114,631 A | * | 12/1963 | Sistare et al | 148/431 |
| 3,930,849 A | * | 1/1976 | Krock et al | 148/431 |
| 4,072,515 A | * | 2/1978 | Motoyoshi et al | 148/431 |
| 4,502,899 A | * | 3/1985 | Tsuji et al | 148/431 |
| 5,236,523 A | * | 8/1993 | Shibata | 148/431 |
| 6,028,036 A | * | 2/2000 | Tenbrink et al | 505/237 |

FOREIGN PATENT DOCUMENTS

| EP | 0 554 681 | 1/1993 |
|---|---|---|
| JP | 6-45132 A | 2/1994 |
| JP | 9-115355 A | 5/1997 |
| WO | WO 01/15178 | 3/2001 |

* cited by examiner

Primary Examiner—Roy King
Assistant Examiner—Harry D. Wilkins, III
(74) Attorney, Agent, or Firm—Rothwell Figg Ernst & Manbeck

(57) ABSTRACT

This invention provides a auxiliary material for use with a superconductive material, which auxiliary material is characterized in that MgO alone or MgO and NiO are dispersed in Ag material by internal oxidation. Here, it is preferred that a weight ratio of Ag and MgO or a weight ratio of Ag, MgO and NiO is such that MgO is 0.03 to 3.3 wt % and a balance is Ag. Alternatively, Mgo is 0.01 to 1.7 wt %, NiO is 0.02 to 1.3 wt % and a balance is Ag. The auxiliary material of the present invention is manufactured by a process in which after a base material consisting of either and Ag—Mg composition or an Ag—Mg—Ni composition has been dissolved and cast, the base material, when in a process of being formed into a predetermined thickness, is subjected to an internal oxidation which is carried out at a temperature of 650 to 850° C. and continued for 20 to 80 hours in an oxygen atmosphere having a pressure of 3 to 10 atm, followed by being further processed. According to the present invention, the above described material can be used as an auxiliary material for use with a superconductive material, thereby making it possible to produce a tape-like material or a wire-like material which has an improved stability even under a severe condition of a heat energy, i.e., it will not be softened by a heat, nor will it have a reaction with a superconductive material, thus ensuring an extremely high mechanical strength.

3 Claims, No Drawings

AUXILIARY MATERIAL FOR SUPERCONDUCTIVE MATERIAL

DESCRIPTION

1. Technical Field of the Invention

The present invention relates to an auxiliary material for use with a superconductive material to improve the mechanical deflection property of a tape-like or a wire-like superconductive material. In detail, this invention relates to a tape material or a pipe material containing Ag as a base material, particularly to a superconductor auxiliary material (i.e., an auxiliary material for use with a superconductive material) which, by virtue of its specific Ag alloy composition and upon being subjected to a specific oxidation treatment, can offer an excellent thermal stability, i.e., the auxiliary material will not be softened under a severe condition of a heat energy, thereby ensuring an excellent mechanical strength.

2. Background Art

As far as superconductive materials are concerned, in recent years, the public's concern has been shifted from metallic superconductive materials to oxide superconductive materials. This is because the oxide superconductive materials, by virtue of their height critical temperatures and their strong magnetic fields, have been found to have a broad use in various ways, with one example being that an oxide superconductive material can be used in a conductor such as a tape-like conductor and a wire-like conductor.

Here, since oxide conductive materials usually belong to ceramic category, they are often brittle. Accordingly, if an oxide superconductive material is to be put into practical use, it is required that a metal material be formed into a tape and used as an auxiliary material for the superconductive material, thereby forming a multi-layered composite structure. Alternatively, such a multi-layered composite structure may be filled into a pipe, so as to improve its mechanical deflection property.

However, an auxiliary material for use with a superconductive material is required not only to be able to strengthen the superconductive material, but also to have a flexibility which is regarded as an important aspect. Further, such an auxiliary material is not allowed to have a crack and a break. As a result, there have been appeared in the commercial market various auxiliary materials formed through different experiments for obtaining various desired properties.

On the other hand, for use as such auxiliary materials, there have been known many kinds of alloy materials each containing Ag as its main component. In this way, a reason as to why several sorts of alloy elements should be added in a superconductor auxiliary material can be explained as: it is because Ag fails to provide a sufficient thermal stability and a sufficient mechanical strength.

Several conventional superconductor auxiliary materials may be described as follows. At first, Japanese Patent Application Publication Laid-Open No. 6-283056 discloses that an Ag alloy serving as a metal base material contains at least one of Mg, Ni, Ti, Mn, Au and Cu, with Mg and Ni being 1 atom % or less, Ti and Mn being 0.5 atom % or less, Au being 30 atom % or less, Cu being 2 atom % or less.

In addition, Japanese Patent Application Publication Laid-Open No.8-241635 has disclosed that at least one of MgO and NiO contained in Ag alloy is converted to Mg and/or Ni, thereby indicating a material containing 0.01 to 0.5 mass % of at least one of Mg and Ni. This prior art teaches that a silver alloy after having been treated in a wire drawing treatment is oxidized in an atmospheric air at 800 to 900° C. for 5 to 50 hours, and the surface of the silver alloy has been oxidized only at a depth of 70 $\mu$m.

However, with regard to the above Prior art, it is difficult to ensure that the above described auxiliary materials for use with superconductive materials can exactly offer a sufficient mechanical strength, a sufficient flexibility and a sufficient softness, all of which are needed as an auxiliary material for use with a superconductive material. Namely, with regard to the above first prior art, when a superconductive material is caused to fill into a pipe material, crack will occur in a pipe during a wire drawing process, causing the pipe to be broken. On the other hand, with regard to the above second prior art, although there is not a problem in relation to a softness during processing, it is usually considered that a desired mechanical strength will become insufficient under a severe condition of a heat energy.

DISCLOSURE OF THE INVENTION

In view of the above, it is an object of the present invention to provide an improved alloy for use as a superconductor auxiliary material which has a sufficient mechanical strength, a sufficient flexibility and a sufficient softness.

The inventor of the present invention, after having carried out a great deal of research for the purpose of solving the above problems, has found that in order to improve the durability and the mechanical strength (to be resistant against a heat energy) of a superconductor auxiliary material, an effective method is to disperse oxides of Mg and Ni in a base material containing Ag as a main component, with the dispersion being effected by virtue of internal oxidation. The object of the present invention is to prevent the occurrence of a crack or damage even within an internal oxide, and such an object has been achieved by virtue of a specific composition and a specific internal oxidation method.

An invention according to claim 1 is a pipe-like or tape-like Ag alloy auxiliary material for use in a process for treating a superconductive material, characterized in that Ag is used as a base material, MgO alone or MgO and NiO formed by internal oxidation are dispersed in the Ag base material, wherein MgO is 0.03 to 3.3 wt % and a balance is Ag, or MgO is 0.01 to 1.7 wt %, NiO is 0.02 to 1.3 wt % and a balance is Ag.

In this way, the present invention is formed by dispersing MgO and NiO through an internal oxidation. This constitution is not at all disclosed in the above described prior art. That is, the above described first prior art is that whose oxidation is carried out in an atmospheric air which is different from that used in the present invention. Moreover, the first prior art does not inherently teach an oxide amount specified in the present invention. On the other hand, the above described second prior art is that which is capable of oxidizing the surface of Ag material at a depth of only 70 $\mu$m. The present invention is significantly different from this prior art in that the present invention employs an Ag alloy before combining a superconductive material with an auxiliary material, with Mg and Ni being internally oxidized under a specific condition, thereby forming an auxiliary material which failed to be obtained in the above Prior art.

Here, the alloy composition used in the present invention is such that when only MgO is dispersed in Ag material, the weight ratio of MgO is 0.03 to 3.3 wt %. On the other hand, when MgO and NiO are both dispersed, the weight ratios of MgO and NiO are respectively in a range of 0.01 to 1.7 wt % and a range of 0.02 to 1.3 wt %. The reason for these weight ratio ranges may be explained as follows. Namely, if MgO and NiO are respectively less than 0.01 wt % and less than 0.02 wt %, it will be difficult to improve the mechanical strength. On the other hand, if the weight ratios are respectively more than 1.7 wt % and more than 1.3 wt %, the material will have an undesirably high hardness, rendering it difficult to process the material.

Furthermore, a method according to the present invention for manufacturing the superconductor auxiliary material is characterized in that; after a base material consisting of either an Ag-Mg composition or an Ag—Mg—Ni composition has been dissolved and cast, the base material is rolled or subjected to a pipe drawing treatment, and in a process of being formed into a predetermined thickness and a predetermined length, the base material is subjected to an internal oxidation which is carried out at a temperature of 650 to 850° C. and continued for 20 to 80 hours in an oxygen atmosphere having a pressure of 3 to 10 atm, followed by a further rolling treatment and a further pipe drawing treatment, thereby producing a tape-like material or a pipe-like material having a predetermined thickness and a predetermined length.

In the process in which Ag Mg composition or Ag Mg Ni composition is subjected to an internal oxidation while the base material is being processed, oxygen at a high temperature and under a pressurized condition is caused to penetrate through the material to gradually oxidize the internal Mg and Ni. However, at this time, Ag itself is not oxidized, but rather allows the oxygen to pass to the inner central portion of the material. The temperature for effecting the internal oxidation is preferably in the range of 700 to 800° C.

When manufacturing the superconductor auxiliary material using the method recited in claim 2, it is preferred (as recited in claim 3) that Ag-Mg composition or Ag—Mg—Ni composition each serving as a base material be so formed that Mg is 0.02 to 2.0 wt %, with a balance being Ag. Alternatively, Mg is 0.01 to 1.0 wt %, Ni is 0.01 to 1.0 wt %, with a balance being Ag.

The reason for the above ranges may be explained as follows. Namely, by setting the composition of the base material within the above ranges, it is possible to set the weight ratios of MgO and NiO within desired ranges suitable for the superconductor auxiliary material of the present invention. That is, it is possible to set the weight ratios so that MgO is 0.03 to 3.3 wt %, alternatively, MgO is 0.01 to 1.7 wt % and NiO is 0.02 to 1.3 wt %.

In this way, by internally oxidizing Mg and Ni (having the specific weight ratios) under the specific condition, it is possible to produce a wire product having a sufficiently high flexibility.

Furthermore, a pipe material serving as a wire material in the present invention is obtained by stretching an elongate filled material formed by filling the interior of an auxiliary material with an oxide superconductive material which is relatively brittle. However, when a tape-like material is to be formed, an auxiliary material is combined with an oxide superconductive material to form a composite. Then, several layers of such composite are laminated together, forming a laminated structure which is then covered by an oxide of Ag alloy.

BEST MODE FOR CARRYING OUT THE INVENTION

Next, a detailed description is given with reference to the following examples.

EXAMPLE 1

A composition containing Ag, 0.1 wt % of Mg and 0.1 wt % of Ni was dissolved. A cast solid cylindrical object having a length of 250 mm and a diameter of 108 mm was processed so as to form a hollow cylindrical body having an outer diameter of 68 mm and an inner diameter of 40 mm. Afterwards, a pipe drawing treatment (rough processing) was carried out so as to form a hollow cylindrical body having an outer diameter of 46 mm, an inner diameter of 38 mm, and a thickness of 4.0 mm. Subsequently, the hollow cylindrical body was subjected to an internal oxidation treatment which was conducted in an oxygen atmosphere having a pressure of 5 atm and was continued for 50 hours at a temperature of 750° C. The material treated in the internal oxidation was a composition containing Ag, 0.13 wt % of MgO and 0.17 wt % of NiO.

The material treated in the above process was further subjected to a pipe drawing treatment (a finishing process), thereby producing a pipe-like member having an outer diameter of 25 mm, an inner diameter of 22 mm, and a thickness of 1.5 mm.

The physical properties of the processed material are such that its tensile strength is 510 MPa, its hardness is 95 Hv, its electric conductivity is 71% IACS, its elongation is 1.0%, its Young's modulus is $3.45 \times 10^4$ MPa, and its specific resistance is $2.40 \times 10^{-8}$ Ωm.

Then, an oxide superconductive material was incorporated into the above auxiliary material which was then formed into a plurality of bundles that were further subjected to a wire drawing treatment, thereby producing a plurality of superconductive wires and proving an acceptable workability not involving a crack or a break.

EXAMPLES 2 to 4

With the use of the same method as used in Example 1, base materials consisting of Ag—Mg or Ag—Mg—Ni were processed, followed by internal oxidation, thereby producing superconductor auxiliary materials. Then, various physical properties of the auxiliary materials were measured. The following Table 1 shows the measurement results indicating the compositions and physical properties of the auxiliary materials produced in all the Examples.

TABLE 1

| | | Composition | | Tensile strength (MPa) | Hardness (Hv) | elongation (%) | Young's modulus (×10$^4$MPa) | Specific resistance (×10$^8$Ωm) |
|---|---|---|---|---|---|---|---|---|
| | | Mg MgO | Ni NiO | finished pipe | finished pipe | finished pipe | finished pipe | finished pipe |
| Example 1 | before oxidation | 0.10 | 0.10 | 510 | 95 | 1.0 | 3.45 | 2.40 |
| | after oxidation | 0.17 | 0.13 | | | | | |

TABLE 1-continued

|  |  | Composition | | Tensile strength (MPa) | Hardness (Hv) | elongation (%) | Young's modulus (×10⁴MPa) | Specific resistance (×10⁸Ωm) |
|---|---|---|---|---|---|---|---|---|
|  |  | Mg MgO | Ni NiO | finished pipe | finished pipe | finished pipe | finished pipe | finished pipe |
| Example 2 | before oxidation | 0.05 | 0.05 | 480 | 88 | 1.5 | 3.20 | 2.20 |
|  | after oxidation | 0.08 | 0.06 |  |  |  |  |  |
| Example 3 | before oxidation | 1.00 | 0.40 | 570 | 110 | 0.8 | 3.60 | 2.50 |
|  | after oxidation | 1.65 | 0.51 |  |  |  |  |  |
| Example 4 | before oxidation | 1.00 | — | 560 | 105 | 0.9 | 3.55 | 2.45 |
|  | after oxidation | 1.62 | — |  |  |  |  |  |

Then, an oxide superconductive material was incorporated into the above auxiliary materials which were then formed into a plurality of bundles that were further subjected to a wire drawing treatment, thereby producing a plurality of superconductive wires and proving an acceptable workability without involving a crack or a break. Meanwhile, the above materials were also formed into tapes using the same method as used in the above, and it was found that their physical properties and their workabilities were acceptable.

INDUSTRIAL APPLICABILITY

As explained in the above, the present invention is different from the above described conventional superconductor auxiliary materials. This is because the present invention employs an Ag alloy containing Ag—MgO or Ag—MgO—NiO with a specific ratio, and also employs a specific oxidation method. Therefore, the material formed according to the present invention can be used as a superconductor auxiliary material, thereby making it possible to produce a tape-like material or a wire-like material which has an improved stability even under a severe condition of a heat energy, i.e., it will not be softened by a heat, nor will it have a reaction with a superconductive material, thus ensuring an extremely high mechanical strength.

What is claimed is:

1. A composite material, wherein said composite material consists essentially of an Ag alloy material in a pipe or tape form and a superconductive material, wherein said Ag alloy material at least partially encloses the superconductive material, and wherein said Ag alloy material consists essentially of Ag as a base material and MgO, wherein the MgO is dispersed in Ag base material and formed through the process of internal oxidation, wherein said MgO is 0.03 to 3.3 wt % of the Ag alloy material, the balance being Ag, wherein said internal oxidation is performed at a pressure of 3–10 atm at 700–800° C.

2. The composite material of claim 1, wherein the composite material is in the form of a pipe.

3. A composite material, wherein said composite material consists essentially of an Ag alloy material in a pipe or tape form and a superconductive material, wherein said Ag alloy material at least partially encloses the superconductive material, and wherein said Ag alloy material consists essentially of Ag as a base material, and MgO and NiO, wherein the MgO and NiO are dispersed in the Ag base material and are formed in the Ag base material through the process of internal oxidation, wherein MgO is 0.01 to 1.7 wt %, NiO is 0.02 to 1.3 wt % of the Ag alloy material, the balance being Ag, wherein said internal oxidation is performed at a pressure of 3–10 atm at 700–800° C.

\* \* \* \* \*